United States Patent
Fu et al.

(10) Patent No.: US 10,707,162 B2
(45) Date of Patent: *Jul. 7, 2020

(54) METAL-ON-METAL CAPACITORS

(71) Applicant: Apple Inc., Cupertino, CA (US)

(72) Inventors: Yi Chun A. Fu, Santa Clara, CA (US); Mansour Keramat, Los Gatos, CA (US); Vijay Srinivas, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/599,011

(22) Filed: Oct. 10, 2019

(65) Prior Publication Data

US 2020/0043846 A1 Feb. 6, 2020

Related U.S. Application Data

(63) Continuation of application No. 15/890,135, filed on Feb. 6, 2018, now Pat. No. 10,453,791.

(51) Int. Cl.
| | |
|---|---|
| *H01L 23/522* | (2006.01) |
| *H01G 4/01* | (2006.01) |
| *H01G 4/228* | (2006.01) |
| *H01L 49/02* | (2006.01) |
| *H01G 4/38* | (2006.01) |
| *H03M 1/20* | (2006.01) |
| *H03M 1/46* | (2006.01) |
| *H01G 4/06* | (2006.01) |
| *H03M 1/80* | (2006.01) |

(52) U.S. Cl.
CPC ........... *H01L 23/5223* (2013.01); *H01G 4/01* (2013.01); *H01G 4/06* (2013.01); *H01G 4/228* (2013.01); *H01G 4/38* (2013.01); *H01L 28/60* (2013.01); *H01L 28/86* (2013.01); *H01L 28/92* (2013.01); *H03M 1/20* (2013.01); *H03M 1/468* (2013.01); *H03M 1/804* (2013.01)

(58) Field of Classification Search
None
See application file for complete search history.

(56) References Cited

U.S. PATENT DOCUMENTS

| | | | |
|---|---|---|---|
| 5,322,438 | A | 6/1994 | McNutt et al. |
| 5,635,421 | A | 6/1997 | Ting et al. |
| 7,403,147 | B2 | 7/2008 | Klaassen |
| 7,446,365 | B1 | 11/2008 | Heshami et al. |
| 7,453,136 | B2 | 11/2008 | Hakkarainen et al. |
| 7,456,462 | B1 | 11/2008 | Heshami et al. |

(Continued)

OTHER PUBLICATIONS

Brenna, Stefano et al., An Effective Tool for the Assisted Design of SAR ADCs Capacitive DACs, Integration the VLSI Journal, 14 pages, Dec. 2015.

*Primary Examiner* — Lex H Malsawma
(74) *Attorney, Agent, or Firm* — Jaffery Watson Mendonsa & Hamilton LLP

(57) ABSTRACT

Capacitor structures with pitch-matched capacitor unit cells are described. In an embodiment, the capacitor unit cells are formed by interdigitated finger electrodes. The finger electrodes may be pitch-matched in multiple metal layers within a capacitor unit cell, and the finger electrodes may be pitch-matched among an array of capacitor unit cells. Additionally, border unit cells may be pitch-matched with the capacitor unit cells.

18 Claims, 4 Drawing Sheets

(56) References Cited

U.S. PATENT DOCUMENTS

| | | |
|---|---|---|
| 7,473,955 B1 | 1/2009 | Heshami et al. |
| 7,663,207 B2 | 2/2010 | Kikuta et al. |
| 9,083,372 B2 | 7/2015 | Rud et al. |
| 9,418,788 B2 | 8/2016 | Srinivas et al. |
| 10,453,791 B2 * | 10/2019 | Fu .......................... H01L 28/60 |
| 2004/0129966 A1 | 7/2004 | Giuroiu et al. |
| 2006/0086965 A1 | 4/2006 | Sakaguchi et al. |
| 2008/0002332 A1 | 1/2008 | Chen |
| 2012/0092806 A1 | 4/2012 | Hua et al. |
| 2013/0222167 A1 | 8/2013 | Keramat et al. |
| 2013/0342955 A1 | 12/2013 | Zhang et al. |
| 2014/0049872 A1 | 2/2014 | Huang et al. |
| 2015/0263754 A1 | 9/2015 | Srinivas et al. |
| 2019/0244894 A1 | 8/2019 | Fu et al. |

* cited by examiner

METAL-ON-METAL CAPACITORS

CROSS-REFERENCE

This application is a continuation of co-pending U.S. patent application Ser. No. 15/890,135 filed Feb. 6, 2018, which is hereby incorporated herein by reference.

BACKGROUND

Field

Embodiments described herein relate to capacitors used in semiconductor devices. More particularly, embodiments described herein are related to capacitors within an analog-to-digital converter circuit.

Background Information

A capacitor digital-to-analog convertor (DAC) is a useful component in mixed signal circuits and compared to other types of DAC has the advantage of lower power. The advantage of a capacitive DAC lies in the compact area and its low power. One of the most common uses for a capacitive DAC is in a successive approximation register (SAR) analog-to-digital converter (ADC). In literature, high resolution SAR ADCs have large total capacitors to improve matching accuracy for the tiny lowest significant bit (LSB) capacitors, which increases chip area thus reducing the benefit of a capacitive DAC.

SUMMARY

Capacitor structures with capacitor unit cells are described. In an embodiment, a capacitor structure includes an array of capacitor unit cells surrounded by a plurality of border unit cells. Each capacitor unit cell may include a first plurality of finger electrodes interdigitated with a second plurality of finger electrodes, and each border unit cell may include a first plurality of dummy finger electrodes interdigitated with a second plurality of dummy finger electrodes. In an embodiment, the first and second plurality of finger electrodes are pitched-matched across the array of capacitor unit cells, and the first and second plurality of dummy finger electrodes are pitch-matched with the first and second plurality of finger electrodes. For example, the first and second plurality of dummy finger electrodes may be characterized by dimensions and pitch as the first and second pluralities of finger electrodes. The array of capacitor unit cells may be formed of a plurality of capacitor main unit cells, and a plurality of capacitor sub-unit cells, with each capacitor main unit cell and each capacitor sub-unit cell characterized by an approximately equivalent via density as well. Similarly, the border unit cells may have the same approximately equivalent via density.

In an embodiment, the capacitor structure includes terminals integrated into the capacitor unit cells. In one implementation a capacitor structure includes a lower metal layer including a first array of finger electrodes interdigitated with a second array of finger electrodes within a corresponding array of capacitor unit cells, and an upper metal layer including a third array of finger electrodes interdigitated with a fourth array of finger electrodes within the array of capacitor unit cells, where the first and second arrays of finger electrodes are orthogonal to the third and fourth arrays of finger electrodes. In an embodiment, the first array of finger electrodes includes a common lower rail extending through a first series of capacitor unit cells within the array of capacitor unit cells, with a corresponding series of the first array of finger electrodes and the third array of finger electrodes are electrically connected to the common lower rail. In addition, the fourth array of finger electrodes may include a common upper rail extending through a second series of capacitor unit cells within the array of capacitor unit cell, with a corresponding series of the fourth array of finger electrodes and the second array of finger electrodes electrically connected to the common upper rail. The common lower and upper rails may additionally extend through corresponding border cells.

In an embodiment, the capacitor structure may leverage an underlying transistor poly layer to form power de-coupling capacitors. For example, a capacitor structure may include a lower metal layer including a first array of finger electrodes interdigitated with a second array of finger electrodes within a corresponding array of capacitor unit cells, and an upper metal layer including a third array of finger electrodes interdigitated with a fourth array of finger electrodes within the array of capacitor unit cells. A polysilicon layer may be located below the lower metal layer, and include a fifth array of finger electrodes interdigitated with a sixth array of finger electrodes. In one configuration, the first, second, fifth, and sixth arrays of finger electrodes are orthogonal to the third and fourth arrays of finger electrodes. In an embodiment, the fifth array finger electrodes is coupled to ground, while the sixth array of finger electrodes is coupled to power.

DETAILED DESCRIPTION

Figure 1:
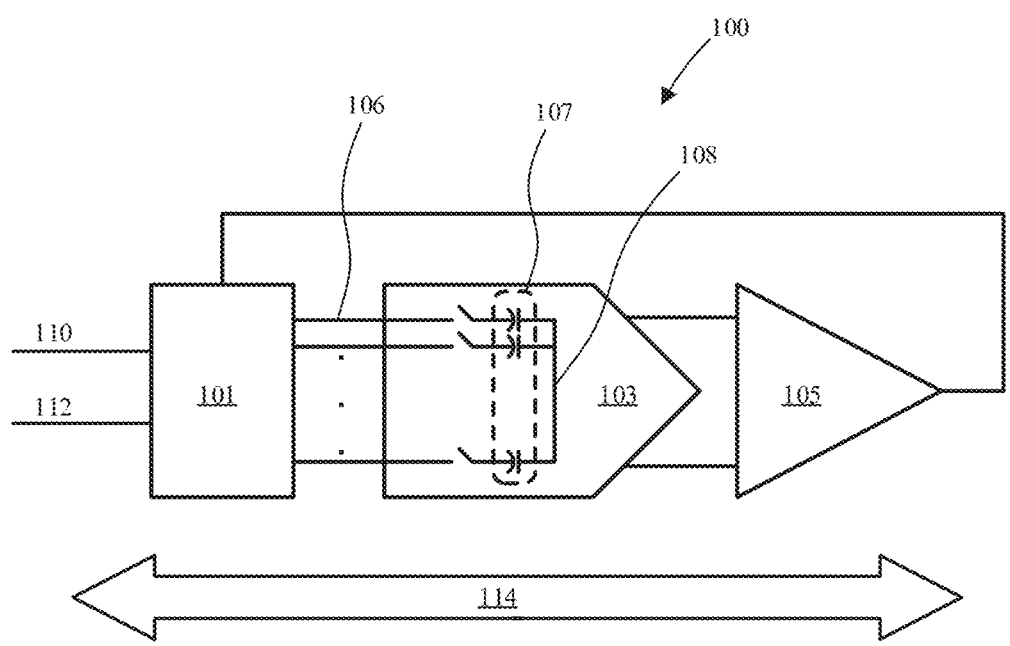
FIG. 1 is a block diagram of an analog-to-digital converter (ADC) in accordance with an embodiment.

Embodiments describe metal-oxide-metal (MOM) capacitor structures that may be used in emerging integrated circuit designs, and accommodate the complex design fabrication rules and multiple patterning complications. The structures in accordance with embodiments may achieve higher capacitance density than conventional structures with improved matching and lower silicon die area requirement. Furthermore, embodiments may also be implemented as sub-femto farads compact capacitance structures for low power requirements. The other possible applications include programmable gain amplifier, digital to analog converters, gain stages.

A capacitor DAC is an array structure of the small unit capacitors. The total capacitor value is dictated by the performance requirement. In majority of the applications, the total size of the capacitor array is determined by the smallest unit cell that can be generated to satisfy the matching requirement. In one aspect, the capacitor structures in accordance with embodiments may be fabricated in a compact area, such as less than 5 µm×5 µm for each capacitor unit cell, fall in the smallest area bin in the area guidelines, and mitigate wasted space. The capacitors structures in accordance with embodiments may include one or more capacitors, composed of one or more capacitor main unit cells and capacitor sub-unit cells. Collectively, the capacitor main unit cells and capacitor sub-unit cells may be referred to as capacitor unit cells.

In advanced technologies, it has been observed that one of the major issues for matched capacitors is multiple patterning. Multiple patterning is the process of fabricating a single layer of metal using different masks for processing different fingers. The fabrication rules are complex with forbidden patterns of metal wiring layers and via layers making the design of compact capacitance structures complex. In addition to metal wiring layers, even via layers are multiple patterned and this causes another layer of issue in matched capacitor designs.

The capacitor unit cells in accordance with embodiments may achieve a capacitance which is immune to issues arising from multiple patterning. The capacitor unit cell is repeated to form a matrix of cells. The metal wires and the connecting vias are designed in a way that they are symmetrical across the whole matrix and misalignment in multiple patterning is a mitigated source for capacitance matching issues. In an embodiment, capacitor main unit cells and capacitor sub-unit cells within a same matrix capacitor structure are "pitch-matched." For example, while adjacent capacitor main unit cells and capacitor sub-unit cells may have different electrical connections, and be designed for different capacitances, they may share identical metal wiring layers (finger electrodes), with identical pitch and dimensions. Furthermore, vias used to connect the finger electrodes in multiple metal layers may have a different layout to effect the different electrical connections, while via density remains substantially the same. For example, capacitor main unit cells and capacitor sub-unit cells may have a different arrangement of vias, yet similar via density.

In another aspect, the capacitor structures in accordance with embodiments include terminals integrated into the capacitor unit cell. This differs from traditional MOM capacitance structures in which the terminals of the capacitors are usually placed outside of the capacitor unit cell structure in orthogonal directions, causing considerable area overhead. The capacitor unit cells in accordance with embodiments may accordingly be more flexible to use and facilitate arraying in a matrix fashion.

In yet another aspect, some capacitor structures in accordance with embodiments use matched poly (e.g. polysilicon) layers from the transistor layer to create power de-coupling capacitors. In some embodiments, "pitch-matching" extends to the poly layers, such that repeating transistor structures and gate poly layers are uniform across the capacitor main unit cells and capacitor sub-unit cells within the matrix capacitor structure.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "upper", "lower", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a block diagram is provided of an analog-to-digital converter (ADC) in accordance with embodiments. ADC 100 is an embodiment of an SAR ADC which may be included in a system on chip (SoC) device. ADC 100 includes SAR control unit 101, digital-to-analog converter (DAC) 103, and comparator circuit 105. ADC 100 receives input signal 110 to be measured, reference signal 112, and communicates with other portions of SoC via system bus 114.

SAR control unit 101 may correspond to a state machine or other suitable processing unit designed to adjust and route signals to DAC 103 and comparator 105 in order to determine a digital value corresponding to a voltage level of an input signal. In operation, SAR control unit 101 may receive a command via system bus 114 to begin a measurement of the voltage level of input signal 110. In response to receiving the command, SAR control unit adjusts switches in DAC 103 to couple input signal 110 to a first terminal of each of a plurality of capacitors 107 within DAC 103 and adjust switches to couple a second terminal of each of capacitors 107 to a ground signal. Each of capacitors 107 will begin charging and SAR control unit 101 allows the various capacitors to charge to a voltage level equal to the voltage level of input signal 110, at which point SAR control unit 101 decouples the first terminal from input signal 110. This process is sometimes referred to as "sampling the input."

DAC 103 is implemented as a capacitive DAC, i.e., an array of capacitors are used rather than an array of resistors such as used in resistive DACs. DAC 103 may receive a series of digital signals from SAR control unit 101 and, in response, output a corresponding voltage level. DAC 103 includes capacitors 107 and a plurality of switches that enable the first terminal of each of capacitors 107 to be independently coupled to either input signal 110 or reference signal 112. Capacitors 107 may be designed such that a first capacitor has a first capacitance value and each additional capacitor has a capacitance value equal to one half of the capacitance of the prior capacitor. For example, if the first capacitor has a capacitance of "C," then the second capacitor would have a capacitance of ½ C, the third would have a capacitance of ¼ C, then ⅛ C, and so on.

Once input signal 110 has been sampled, then SAR control unit 101 couples the first terminal of the first capacitor to reference signal 112, then couples the second terminal of each of the plurality of capacitors to a first input of comparator circuit 105. An output of the comparator corresponds to the most significant bit (MSB) of a value corresponding to the voltage level of input signal 110. SAR control circuit 101 decouples the second terminal of the capacitors from comparator circuit 105 and then couples the first terminal of the second capacitor to reference signal 112 and then again couples the second terminal of each capacitor to the first input of comparator circuit 105. The updated output of the comparator corresponds to the second MSB of the value corresponding to the voltage level of input signal 110. This process repeats until all bits of the value corresponding to the voltage level of input signal 110 have been determined. In various embodiments, the result may be stored in a register within SAR control unit 101 or may be output onto system bus 114.

A total number of capacitors required for DAC 103 is dependent upon a resolution of ADC 100, i.e., a number of bits of the value representing the voltage of input signal 110 (i.e., the result). At least one capacitor is needed for each bit. In some embodiments, additional capacitors may be required for sampling input signal 110, for stabilizing or adjusting reference signal 112, for general noise reduction, etc. Accuracy for ADC 100 is dependent on the relative capacitance values of each capacitor for each bit of the result. As mentioned, if the capacitance for the first capacitor corresponding to the MSB is C', then the capacitance for the second capacitor corresponding to the second MSB needs to be ½ C for the best possible accuracy. The more the capacitance of the second capacitor deviates from ½ C, the less accurate the measurement for the second MSB will be. The same principal applies to the remaining capacitors of the plurality of capacitors. Therefore, design of DAC 103 may include capacitor designs that can be adjusted to a fine resolution of capacitance.

The total capacitor value is dictated by the performance requirement. The total size of the capacitor array is, however, determined by the smallest unit cell that can be generated to satisfy the matching requirement. In some embodiments, when compared to other DAC designs, such as, for example, a resistive ladder DAC, a capacitive DAC such as DAC 103 may be characterized by a relatively compact area and low power.

It is noted that ADC 100 of FIG. 1 is merely an example for demonstration of disclosed concepts. Some functional components and some operational details have been omitted to focus on the disclosed subject matter. In other embodiments, additional functional units may be included and operation may deviate from the description above.

Figure 2:
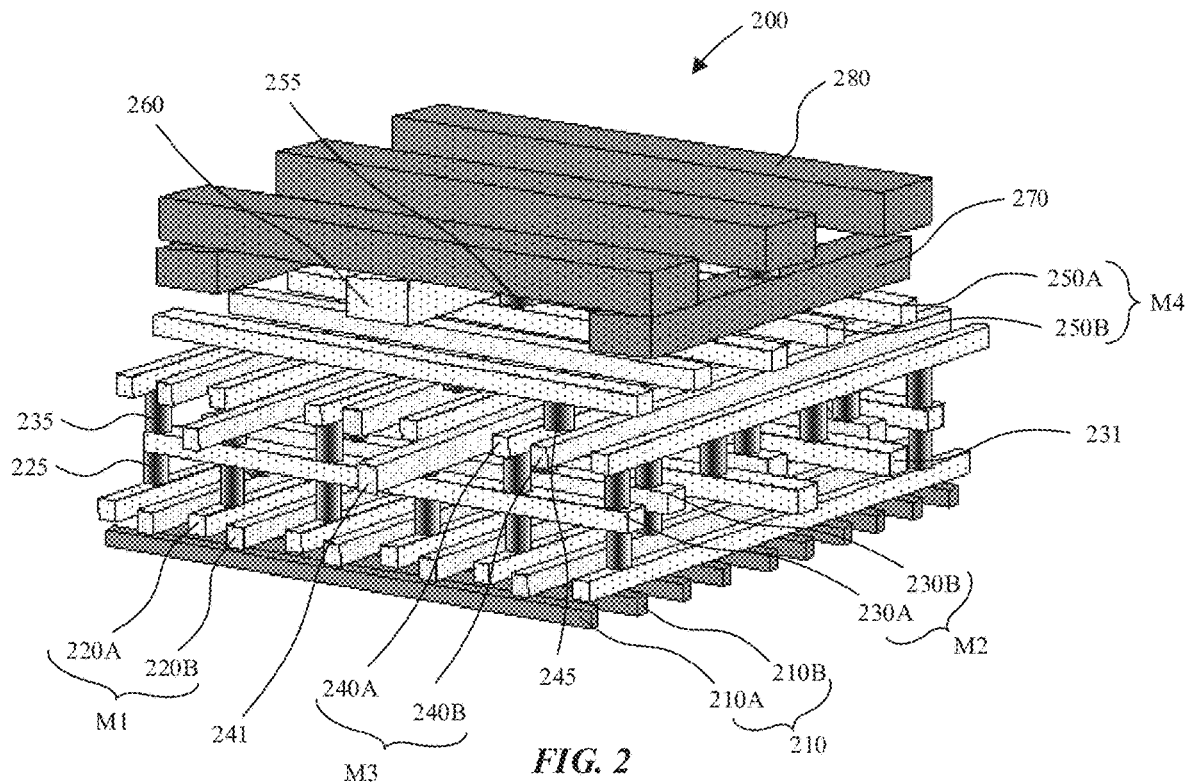
FIG. 2 is a perspective view illustration for a capacitor main unit cell in accordance with an embodiment.

Referring now to FIG. 2, a perspective view illustration is provided for a capacitor main unit cell in accordance with embodiments. The capacitor main unit cell 200 may be one structure used in a capacitive DAC in an SoC, such as, e.g., DAC 103, to create capacitors of various capacitances by linking to other unit capacitor cells. Main unit cell 200 is a three dimensional structure employing a plurality of metal layers formed during manufacture of the SoC. Generally speaking, metal layers in a semiconductor manufacturing process may be referred to in the order each layer is deposited during fabrication, from the first metal layer (M1), and above. The illustrative example provided in FIG. 2 provides finger electrodes formed in M1 through the fourth metal layer (M4), though this is understood to be exemplary, and embodiments are not limited to four metal layers.

In accordance with embodiments, the structure of the capacitor main unit cell 200 may be pitch-matched from the transistor device to the top metal layer, e.g. M4. A top metal grounding structure may additionally be provided to protect the capacitor from external disturbances that may be generated due to addition of dummy shapes nearby to the cell. The interdigitated fingers produce tight couplings and allow the creation of a homogenous array.

As shown, a capacitor main unit cell 200 may be include a first metal layer M1 including an array of finger electrodes 220A interdigitated with an array of finger electrodes 220B. A second metal layer M2 is formed over M1, including an array of finger electrodes 230A interdigitated with an array of finger electrodes 230B. Likewise, metal layers M3, M4 may have arrays of finger electrodes 240A, 250A interdigitated with arrays of finger electrodes 240B, 250B, respectively. Vias 225, 235, 245 may be used to electrically connect the finger electrodes in the meta layers M1-M4. As shown, the interdigitated finger electrodes within a metal layer may be metal wires, and parallel to one another. The space around the finger electrodes and vias are filled by a dielectric material, not illustrated for visualization. Exemplary dielectric materials include oxides, such as silicon oxide, and other traditional interlayer dielectric materials, including low dielectric constant (low-k) materials. Capacitance is created in the capacitor main unit cell 200 due to effects of electric fields across the interdigitated and stacked finger electrodes. The amount of capacitance may be determined by dimension of the finger electrodes, and properties of the dielectric material(s).

In the embodiment illustrated, finger electrodes 220A, 230A, 240A, 250A in different metal layers are electrically connected by the vias, while finger electrodes 220B, 230B, 240B, 250B are electrically connected by the vias. These respective finger electrodes, may also be electrically separate. For example, finger electrodes 220A-250A may be connected to a digital logic bit node 106 to the SAR control 101, while finger electrodes 220B-250B are connected to a floating node 108 to the comparator 105 input. In accordance with embodiments, the finger electrodes in adjacent metal layers may be orthogonal to each other. For example, finger electrodes 220A, 220B, 240A, 240B are orthogonal to finger electrodes 230A, 230B, 250A, 250B. In an embodiment, the interior finger electrodes (e.g. 220B, 230B, 240B, 250B) are electrically coupled to a sensitive node, or critical terminal, such as a floating node 108 to the comparator 105 input. Hence, there may be an odd number of interior finger electrodes, to keep stray capacitance on the critical terminal low. In such a configuration, the exterior finger electrodes (e.g. 220A, 230A, 240A, 250A) may be electrically coupled to a less sensitive node, such as a digital logic bit node 106 to the SAR control 101. Hence, there may be an even number of exterior finger electrodes.

In accordance with embodiments, the capacitor main unit cells 200 are internally "pitch-matched." That is, the arrangement of finger electrodes may have identical dimensions and pitch in different metal layers. For example, metal layers M1 and M3 may have identical arrangements of finger electrodes. Metal layers M2 and M4 may likewise have identical arrangements of finger electrodes. Furthermore, dimensions and/or pitch of the finger electrodes may be the same in all metal layers M1-M4. Furthermore, via density and layout may be the same between certain metal layers. In addition, via density may be the same in adjacent dielectric layers (e.g. between M1-M2 compared to M20M3), despite having different arrangements.

In an embodiment, a poly (e.g. polysilicon) layer 210 from the transistor device layer (e.g. from transistor gate poly), is patterned to form finger electrodes that are pitch-matched with the finger electrodes in the overlying metal layers in the unit cell 200. The poly layer 210 can be patterned to form finger electrodes 210A, 210B to create power de-coupling capacitors. For example, the finger electrodes 210A, 210B can be connected to power (e.g. Vdd) and ground, respectively, or vice-versa, to create a capacitor. Alternatively, both finger electrodes 210A, 210B may be connected to ground. Furthermore, the pitch-matched finger electrodes 210A, 210B can be formed over a uniform array of transistors underneath the metal capacitor structure to provide additional uniformity.

Looking now to a top side of the capacitor main unit cell 200, a pattern of ground bars 270, 280 may be formed over the stacked finger electrodes. The ground bars 270, 280 may be formed in multiple metal layers. In the embodiment illustrated, a top metal layer (e.g. M5) includes ground bars 270 on opposite sides of a coupling bar 260. For example, coupling bar 260 may be used to couple to one or more finger electrodes (e.g. 250A) in M4. Thus, M5 may include both one or more coupling bars 260, and ground bars 270. An additional metal layer M6 may be formed over M5, and be patterned to include an arrangement of ground bars 280 that are electrically coupled to ground bards 270 with on or vias. Ground bars 280 may be orthogonal to ground bars 270, and coupling bar 260.

In accordance with embodiments, the terminals for the finger electrodes may be integrated into the capacitor main unit cell 200, and extend through a series of capacitor unit cells. Such a configuration may reduce area overhead, and facilitate arraying in a matrix fashion. For example, the terminals may be integrated into the coupling bar 260, or as part of the finger electrodes. In an embodiment, terminals are integrated into the array of finger electrodes (220B, 230B, 240B, 250B) as a common rail 241. In an embodiment, common rail 241 is electrically coupled to node 106. Common rail 241 may be integrated into any of the metal layers M1-M4 including the finger electrodes. In the example illustrated, one or more common rails 241 are integrated into M3 as part of finger electrodes 240B. Similarly, terminals may be integrated as part of the finger electrodes (220A, 230A, 240A, 250A) as a common rail 231 in any of metal layers M1-M4 including finger electrodes. In an embodiment, common rail 231 is electrically coupled to node 108. In the example illustrated, one or more common rails 231 are integrated into M2 as part of finger electrodes 230A, though this specific metal layer is exemplary and embodiments are not so limited. The common rails 231, 241 may also function as, and share the same dimensions (e.g. width, thickness) with the surrounding finger electrodes. However, common rails 231, 241 may be longer than the finger electrodes so that they can extend to an adjacent unit cell or border cell. In an embodiment, coupling bar 260 is utilized as a terminal/common rail for finger electrodes (220B, 230B, 240B, 250B).

The capacitor main unit cells 200 of FIG. 2 may be arrayed in the DAC 103 section of the SAR ADC, with the unit cell capacitance developed keeping in mind array symmetry requirements. In an embodiment, one capacitor main unit cell 200 represents the 2nd least significant bit (LSB). Capacitors 107 may include arrays of capacitor main unit cell 200, as well as arrays of sub-unit cells, and combinations thereof to achieve the specific capacitances of the capacitors 107. For example, capacitor sub-unit cells may be created with a pitch-matched structure in which the dimensions, and pitch of the finger electrodes remains the same (e.g pitch-matched), with different electrical connections and via connections. This may be achieved by adding a third terminal, for electrical connection to a subset of the finger electrodes. For example, the third terminal may be from the poly layer or M4/M5 layer from the exemplary embodiment illustrate. As a result, each unit cell can have three capacitors, A-B, A-GND, B-GND where A and B are the terminals of the capacitors, and GND represents the third terminal, or ground. In accordance with embodiments, rearrangement of vias may be done in a pitch-matched manner.

Figure 3:
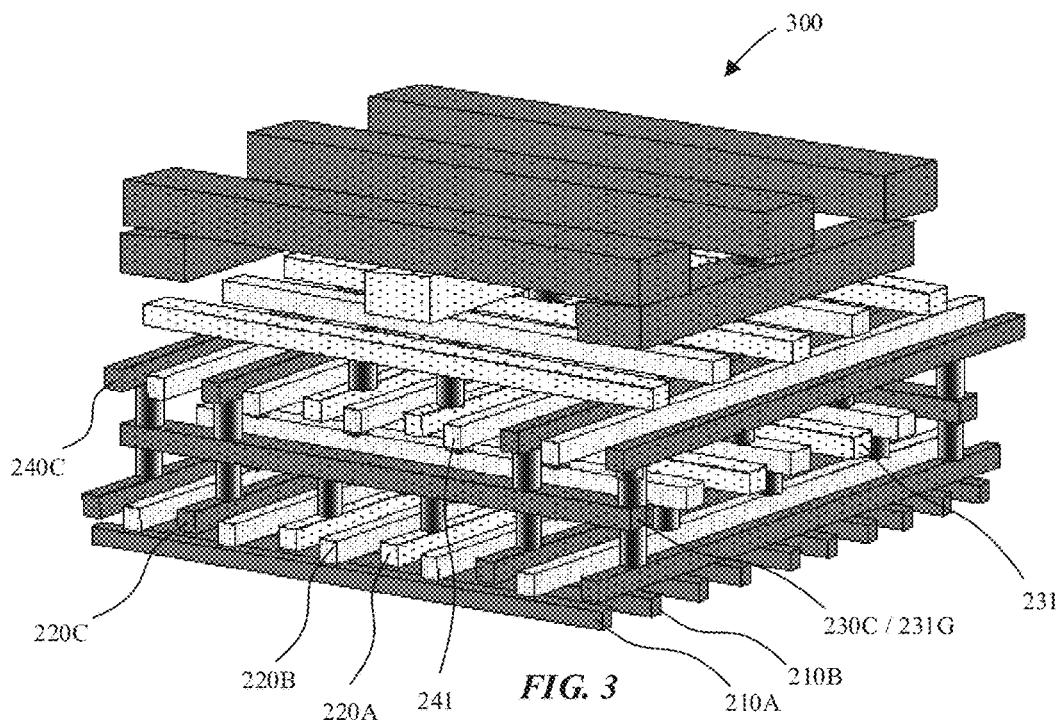
FIG. 3 is a perspective view illustration for a capacitor sub-unit cell in accordance with an embodiment.

Referring now to FIG. 3, a perspective view illustration is provided for a capacitor sub-unit cell 300 in accordance with embodiments. The capacitor sub-unit cell 300 may be a three dimensional structure similar to unit cell 200 used in a capacitive DAC in an SoC, such as, e.g., DAC 103. In the specific embodiment illustrated, the capacitor sub-unit cell 300 is a half-unit cell, though embodiments are not so limited. For example, quarter-unit cells or other sub-units may be used in accordance with embodiments. In an embodiment, the capacitor sub-unit cell 200 of FIG. 2 represents the 2nd LSB, while the capacitor main unit cell 300 of FIG. 3 represents the 1st LSB. Other variations are contemplated. In an exemplary half-unit cell structure two different capacitors are formed a single capacitor sub-unit cell structure. This causes the capacitance to exactly divide into and by connecting one of the terminal properly, an accurate half capacitance is achieved from the cell.

As shown in FIG. 3, the capacitor sub-unit cell 300 is pitch-matched with the capacitor main unit cell 200. In the embodiment illustrated, the arrangement and electrical connections to the finger electrodes 220B, 230B, 240B, 250B remains the same, while a first portion of the finger electrodes 220A, 230A, 240A, 250A remains connected to common rail 241, and a second portion of the finger electrodes 220A, 230A, 240A, (now 220C, 230C, 240C) is now electrically connected to ground. In an embodiment, this is achieved by connecting the second portion of the finger electrodes 220A, 230A, 240A, (now 220C, 230C, 240C) to the ground bars 270, 280 and/or finger electrodes 210B (ground). Alternatively, this may be achieved using a second common rail 231G.

In the particular embodiment illustrated, the number of finger electrodes 220B, 230B, 240B, 250B connected to the sensitive node (e.g. node 108) remains the same. Thus, only the connections and via arrangements to finger electrodes 220A, 230A, 240A, is changed. In the exemplary embodiment illustrated, finger electrodes 250A remain wholly connected to common rail 231. In other embodiments, a second portion of finger electrodes 250A may also be electrically connected to ground. In addition, in the embodiment illustrated in FIG. 3, finger electrodes 210A, 210B are pitch-matched and electrically coupled in the same manner as in FIG. 2, forming a de-coupling capacitor structure. Similarly, the pitch-matched finger electrodes 210A, 210B can be formed over a uniform array of transistors underneath the metal capacitor structure to provide additional uniformity. Thus, the array of transistors is uniform, and pitch-matched across the capacitor main unit cells 200 and capacitor sub-unit cells 300.

Figure 4:
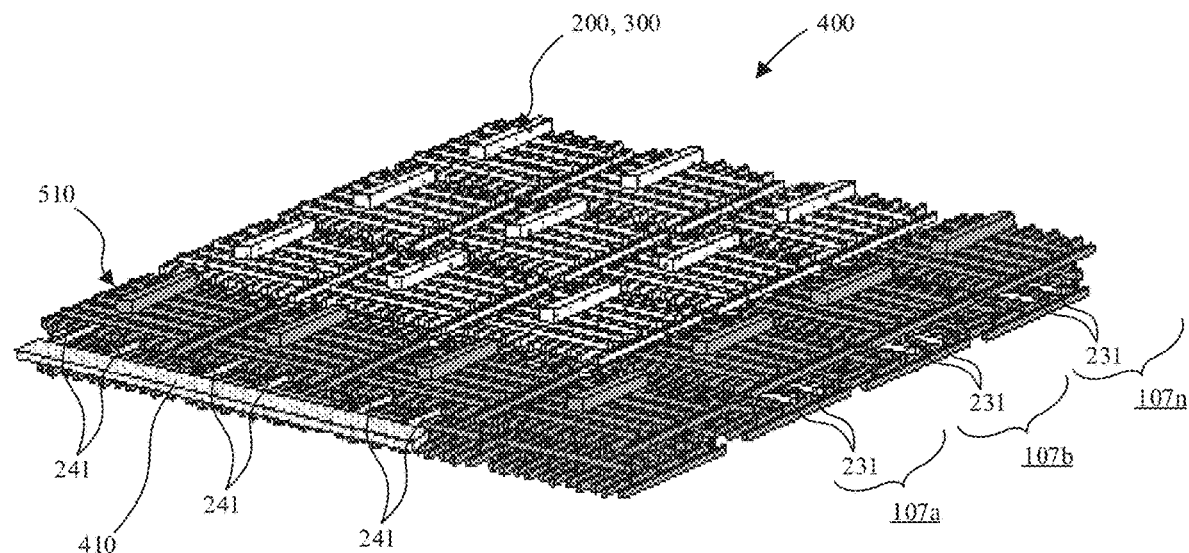
FIG. 4 is a perspective view of a capacitor structure in accordance with an embodiment.
Figure 5:
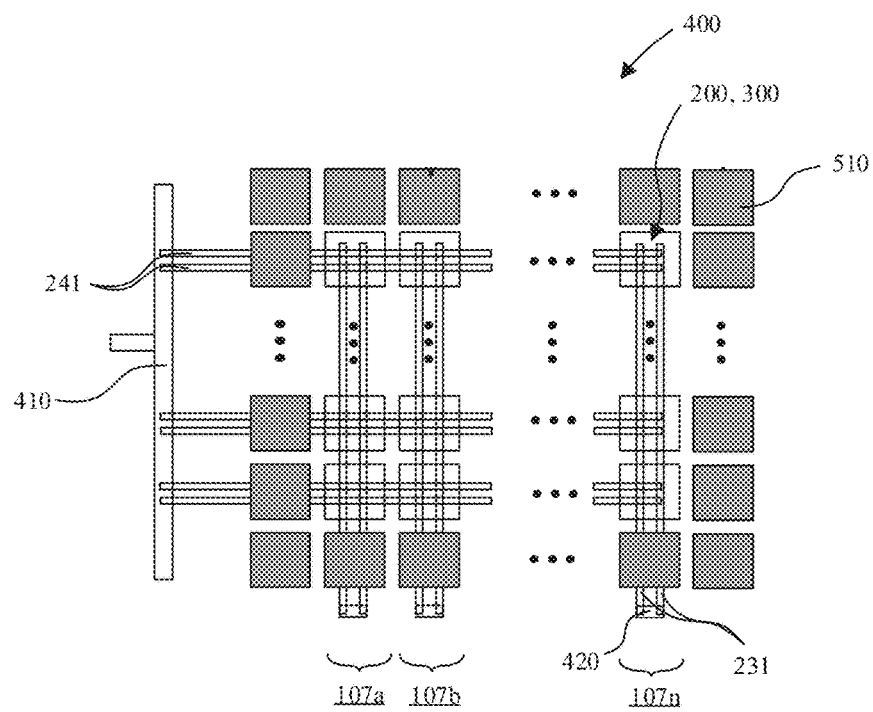
FIG. 5 is a schematic top view illustration of a capacitor structure in accordance with an embodiment.

Referring now to FIGS. 4-5, a perspective view and schematic top view illustration, respectively, are provided of a capacitor structure in accordance with embodiments. As shown, the capacitor structure 400 includes 2-dimensional array, or matrix, of capacitor unit cells 200 and/or 300. Capacitors 107 can be created from capacitor unit cells 200, 300 from one or more rows or columns. In the embodiment illustrated, three capacitors 107a-n are shown, though this is exemplary. The matrix of capacitor unit cells may additionally be surrounded by a pattern (e.g. a boundary) of pitch-matched border unit cells 510. The border units cells shown illustrated by darker shading may be specially designed to maintain symmetry. They may be exactly the same size of a capacitor unit cell to make sure that the capacitor unit cells see the same capacitance and structure on both of its sides. This ensures that the stray capacitance is uniform leading to more uniform differential non-linearity (DNL) distribution.

Additionally, identical arrays of transistors may be located underneath the border unit cells as with the capacitor unit cells.

In an embodiment, common rails 231 in different series (e.g. columns) are not connected to the same terminal interconnects 420, while common rails 241 are connected to a common terminal interconnect 410. Thus, different terminal interconnects 420 may be coupled to different signals. The border unit cells 510 may be substantially identical, and pitch-matched, with the capacitor unit cells 200, 300 with some differences. Foremost, fingers 220A-250A, and 220B-250B correspond to "dummy" fingers in the borer unit cells 510, and may be connected to ground. Additionally, common rails 231, 241 may extend through the border unit cells. In such a structure, the common rails 231, 241 extend through the border unit cells 510, and may not be connected to adjacent metal layers by vias within the border unit cells 510. Yet the same common rails 231, 241 are connected to adjacent metal layers with vias in the corresponding series of capacitor unit cells 200, 300. Alternative arrangements are also possible in addition to those illustrated. For example common rails 231, 241 may be formed in multiple metal layers, and may be connected by vias within the border unit cells 510 or capacitor unit cells 200, 300.

As previously described, the border unit cells 510 may maintain symmetry and wiring densities. This may also be true with via densities. Accordingly, while some via arrangements are different, via density may be the same between border unit cells 510, capacitor main unit cells 200, and the one or more variations of capacitor sub-unit cells 300. Thus, the border unit cells 510 maintain the pitch-matched structure, with subtle reconfigurations to keep the patterns uniform for example with regard to metals and vias, and additional the poly layers and underlying transistors.

In an embodiment, a capacitor structure 400 includes an array of capacitor unit cells 200, 300 surrounded by a plurality of border unit cells 510. The array of capacitor unit cells may be an arrangement of capacitor main unit cells 200, and one more types of capacitor sub-unit cells 300 (e.g. designed for different capacitances). Each capacitor unit cell 200, 300 includes a first plurality of finger electrodes (e.g. 230A) interdigitated with a second plurality of finger electrodes (e.g. 230B). Each border unit cell 510 also includes a first plurality of "dummy" finger electrodes interdigitated with a second plurality of "dummy" finger electrodes. In accordance with embodiments, the first and second plurality of finger electrodes (e.g. 230A, 230B) are pitched-matched across the array of capacitor unit cells 200, 300, and the "dummy" finger electrodes are pitch-matched with the first and second pluralities of finger electrodes (e.g. 230A, 230B). For example, the first and second plurality of dummy finger electrodes can be characterized by same dimensions and pitch as the first and second pluralities of finger electrodes. While the dummy finger electrodes are pitch-matched, they are connected differently. For example, both the first and second pluralities of dummy finger electrodes may be connected to ground.

As described with regard to FIGS. 2-3, the capacitor unit cells 200, 300, and also the border cells, may be formed in multiple metal layers. For example, each capacitor unit cell 200, 300 further includes a third plurality of finger electrodes 240A interdigitated with a fourth plurality of finger electrodes 240B, each of the first and second plurality of finger electrodes 230A, 230B are within a lower metal layer (e.g. M2), and each of the third and fourth plurality of finger electrodes 240A, 240B are within an upper metal layer (e.g. M3), wherein the third and fourth pluralities of finger electrodes 240A, 240B are orthogonal to the first and second pluralities of finger electrodes 230A, 230B. It is to be appreciated that selection of M2 and M3 as lower and upper metal layers, respectively, is made here for illustrative purposes only, and embodiments are not limited to these specific metal layers.

The array of capacitor unit cells 200, 300 may include a plurality of capacitor main unit cells 200, and a plurality of capacitor sub-unit cells 300, both of which may be characterized by an approximately equivalent via density between the lower metal layer (e.g. M2) and the upper metal layer (e.g. M3). Furthermore, the each border unit cell 510 may include vias between M2 and M3, also characterized by the approximately equivalent via density.

The capacitor structures 400 in accordance with embodiments may additionally include terminals integrated into the capacitor unit cells 200, 300. For example, the first array of finger electrodes 230A may include a common lower rail (for example, common rail 231 located in M2, though the common rail may be located in any metal layer) extending through a first series of capacitor unit cells within the array of capacitor unit cells. In this manner, the first array of finger electrodes 230A and the third array of finger electrodes 240A are electrically connected to the common lower rail 231 and terminal interconnect 420. The common lower rails 231 may be connected to each other, and same terminal interconnect 420, in a way to form a binary DAC. Alternatively, the common lower rails 231 for different series of capacitors may be connected corresponding separate terminal interconnects 420 in a way to form a segmented DAC.

Likewise, the fourth array of finger electrodes 240B may include a common upper rail (e.g. 241 located in M3) extending through a second series of capacitor unit cells within the array of capacitor unit cells. A corresponding series of the fourth array of finger electrodes 240B and the second array of finger electrodes 230B are electrically connected to the common upper rail (e.g. 241). In an embodiment, the plurality of common upper rails 241 are connected to a terminal interconnect 410. In an embodiment, the common lower rail 231 extends through a first border unit cell 510, while the common upper rail 241 extends through a second border unit cell 510.

The capacitor structures 400 in accordance with embodiments may additionally use matched poly (e.g. polysilicon) layers from the transistor layer to create power de-coupling capacitors. For example, a poly layer 210 below the lower metal layer (e.g. M2, as well as M1) may include a fifth plurality of finger electrodes 210A, interdigitated with a sixth plurality of finger electrodes 210B, where the first, second, fifth, and sixth pluralities of finger electrodes (230A, 230B, 210A, 210B), are orthogonal to the third and fourth pluralities of finger electrodes (240A, 240B). The fifth and sixth plurality of finger electrodes (210A, 210B) may optionally be pitch-matched with the first and second plurality of finger electrodes (230A, 230B), though the patterned poly layer may have a different pitch and dimensions.

Figure 6:
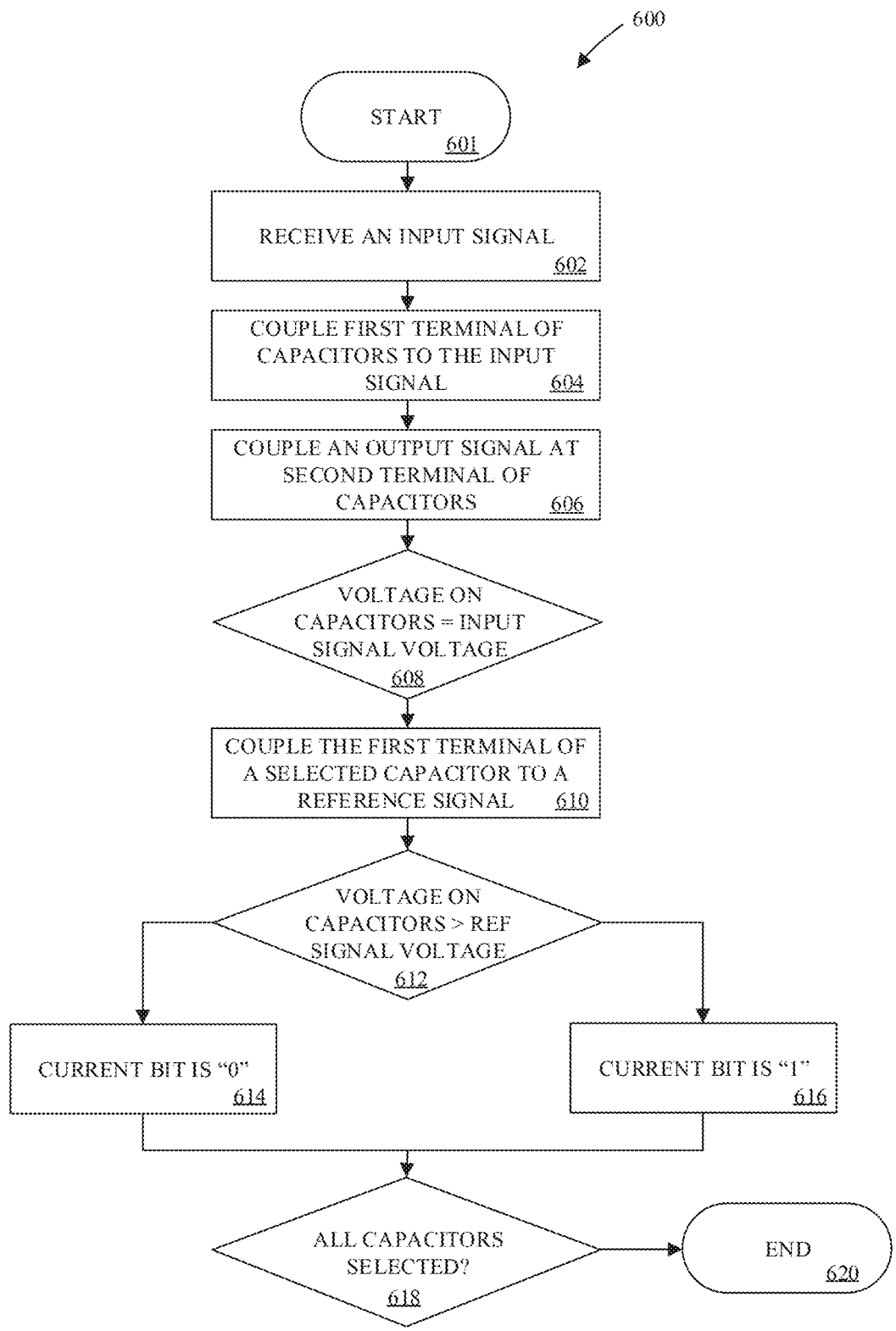
FIG. 6 is a flowchart of a method for operating an analog-to-digital converter in accordance with an embodiment.

Referring now to FIG. 6, a flowchart of a method for operating an embodiment of an analog-to-digital converter (ADC) is shown. Method 600 may be used to operate a SAR ADC, such as, for example, ADC 100 in FIG. 1. ADC 100 may further include a capacitor array such as, for example, capacitor array 400 in FIG. 6. Referring collectively to FIG. 1 and FIG. 6, the method may begin in block 601.

ADC 100 receives an input signal (block 602). The input signal corresponds to a signal for which a voltage level is to be measured. The input signal may have a slowly changing (relative to the conversion speed of ADC 100) voltage level.

For example, an output of a temperature sensor in an enclosure may change some number of millivolts per second. In other embodiments, the voltage level of the input signal may change more rapidly, such as, e.g., an output of a microphone, which may rise and fall by a volt in less than one microsecond. In some embodiments, in particular to measure a fast transitioning input signal, ADC 100 may sample the input signal for a predetermined period of time to capture the voltage level at a particular point in time.

ADC 100 connects the input signal to a first terminal of a plurality of capacitors 107 (107a-n) in capacitor array 400 (block 602). DAC may include a plurality of switching circuits (e.g., analog multiplexers, transmission gates, etc.) to couple the input signal or other reference signals to each of the plurality of capacitors. In some embodiments, the plurality of capacitors 107 may include all capacitors in capacitor array 400 while in other embodiments, a proper subset of capacitors in array 400 may be included in the plurality of capacitors. SAR control logic 101 adjusts the switching circuits to couple the input signal to the first terminal of each of the plurality of capacitors. The first terminal may correspond to terminal interconnects 420 coupled to common rails 231 of capacitor unit cells 200, 300 for capacitors 107a-n.

SAR control logic 101 adjusts switching circuits to couple terminal interconnects 410 to a ground reference voltage while terminal interconnects 420 are coupled to the input signal (block 606). This adjustment allows capacitors 107a-n to charge to the current voltage level of the input signal. Charging the capacitors to the voltage level of the input signal may be referred to as "sampling" the input signal. It is noted that if the voltage level across capacitors 107a-n begins higher than the voltage level of the input signal, then capacitors 107a-n will discharge rather than charge to reach the voltage level of the input signal.

The further actions of the method may depend on the voltage level across each capacitor of the plurality of capacitors (block 608). In some embodiments, SAR control logic may keep terminal interconnects 420 coupled to the input signal and terminal interconnects 410 coupled to the ground reference for a predetermined amount of time long enough to ensure the voltage level across capacitors 107a-n is equal to the voltage level of the input signal. In other embodiments, comparator 105 may be used to determine that capacitors 107a-n have charged to the voltage level of the input signal. In either embodiment, if the voltage level across capacitors 107a-n is not equal to the voltage level of the input signal, then the method may remain in block 608. Otherwise, the method may move to block 610.

One capacitor of the plurality of capacitors may be selected and charged to the voltage level of a reference signal (block 610). Each capacitor of the plurality of capacitors may correspond to one bit of a digital result determined by ADC 100. For example, if ADC 100 includes a twelve-bit result register, then the plurality of capacitors includes at least twelve capacitors, one for each bit of the result (additional capacitors may also be included for signal conditioning or other purposes). The capacitor corresponding to the most significant bit (MSB) of the digital result has the largest capacitance value of the twelve capacitors. The capacitance value for each subsequent capacitor corresponding to the next most significant bit is one-half of the capacitance of the previous capacitor. A value of each of the capacitors in array 400 in DAC 103 is critical to the accuracy of ADC 100. Capacitors in array 400 may be sensitive to parasitic capacitances from surrounding circuits and from mechanical stress due to temperature changes or physical pressure on the IC. Any mismatch in the capacitances may cause non-linearity issues in the ADC performance, resulting in less accurate results. Use of capacitor sub-unit cell 300 in capacitor array 400 may help to achieve a high degree of capacitance matching between the capacitors in array 400, resulting in accurate performance of ADC 100, even in the presence of mechanical and temperature induced stress. To determine the digital result, each capacitor is selected, one at a time beginning with the MSB capacitor, and the terminal interconnect 420 of the selected capacitor is coupled to a first reference voltage signal.

The further actions of the method may again depend on the voltage level across each capacitor of the plurality of capacitors (block 612). After the selected capacitor has been coupled to the reference voltage, the terminal interconnects 410 of the plurality of capacitors, including the selected capacitor, are coupled to comparator 105 and the voltage level at the terminal interconnects 410 is compared to a second reference voltage level. The value of the bit corresponding to the selected capacitor is determined by the output of comparator 105.

If the output of comparator 105 is a logic low, then the value of the bit corresponding to the selected capacitor is a '0' (block 614). A logic low from comparator 105 may correspond to the voltage at the terminal interconnect 410 being less than the second reference voltage.

If the output of comparator 105 is a logic high, then the value of the bit corresponding to the selected capacitor is a '1' (block 616). A logic high from comparator 105 may correspond to the voltage at the terminal interconnect 410 being greater than the second reference voltage.

Further actions of the method may depend on a number of capacitors selected (block 618). If all capacitors corresponding to a bit of the digital result have not been selected and coupled to the second reference voltage, then the method may return to block 610 to select the next capacitor. Otherwise, method 600 may be complete and end in block 620.

It is noted that, in regards to a Complementary Metal-Oxide-Semiconductor Field-Effect Transistor (or Complementary MOSFET, or simply CMOS) circuit design, "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

It is also noted that method 600 is an example method for operating an embodiment of a SAR ADC. Many embodiments of SAR ADCs are known and methods for operating other embodiments may differ from the operations disclosed in method 600. A different number of operations may be performed and some operations illustrated to occur in series may be performed in parallel.

In utilizing the various aspects of the embodiments, it would become apparent to one skilled in the art that combinations or variations of the above embodiments are possible for forming metal-on-metal capacitor structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A capacitor structure comprising:
   an array of capacitor unit cells arranged in a plurality of rows of capacitor unit cells and a plurality of columns of capacitor unit cells;
   wherein each capacitor unit cell of the array of capacitor unit cells comprises a lower metal layer including a first plurality of finger electrodes interdigitated with a second plurality of finger electrodes, and an upper metal layer including a third plurality of finger electrodes interdigitated with a fourth plurality of finger electrodes; and
   wherein the array of capacitor unit cells comprises a plurality of main capacitor unit cells, and a plurality of capacitor sub-unit cells, each capacitor main unit cell and each capacitor sub-unit cell characterized by an approximately equivalent via density between the lower metal layer and the upper metal layer.

2. The capacitor structure of claim 1, wherein the first and second pluralities of finger electrodes are orthogonal to the third and fourth pluralities of finger electrodes.

3. The capacitor structure of claim 2, wherein the first and second pluralities of finger electrodes are pitch-matched across the array of capacitor unit cells.

4. The capacitor structure of claim 3, wherein the third and fourth pluralities of finger electrodes are pitch-matched across the array of capacitor unit cells.

5. The capacitor structure of claim 4, further comprising a plurality of rows of common rails extending through the plurality of rows of capacitor unit cells.

6. The capacitor structure of claim 5, further comprising a plurality of columns of common rails extending through the plurality of columns of capacitor unit cells.

7. The capacitor structure of claim 6, further comprising a common terminal interconnect electrically coupled to the plurality of rows of common rails.

8. The capacitor structure of claim 7, wherein the common terminal interconnect is connected to a comparator input.

9. The capacitor structure of claim 8, wherein the plurality of columns of common rails are connected to a corresponding plurality of digital logic bit nodes.

10. An analog-to-digital (ADC) converter comprising:
    a successive approximation register (SAR);
    a digital-to-analog converter (DAC);
    a plurality of digital logic bit nodes that connect the SAR to the DAC; and
    comparator circuit connected to a floating node of the DAC;
    wherein the DAC includes an array of capacitor unit cells arranged in a plurality of rows of capacitor unit cells and a plurality of columns of capacitor unit cells, and wherein each capacitor unit cell of the array of capacitor unit cells comprises a metal layer including a first plurality of finger electrodes interdigitated with a second plurality of finger electrodes;
    a plurality of rows of common rails extending through the plurality of rows of capacitor unit cells and electrically coupled with a portion of the first plurality of finger electrodes;
    a plurality of columns of common rails extending through the plurality of columns of capacitor unit cells and electrically coupled with a portion of the second plurality of finger electrodes;
    wherein each common rail extending through a column of capacitor unit cells is coupled to a corresponding digital logic bit node of the plurality of digital logic bit nodes, and each common rail extending through a row of capacitor unit cells is coupled to the floating node.

11. The ADC of claim 10, wherein each unit cell comprises an odd number of total finger electrodes of the first and second pluralities of finger electrodes.

12. The ADC of claim 11, wherein the odd number of total finger electrodes includes two exterior finger electrodes, wherein the exterior finger electrodes are not coupled to the floating node.

13. The ADC of claim 12, wherein the exterior finger electrodes are coupled to a digital logic bit node or ground.

14. A capacitor structure comprising:
    an array of capacitor unit cells arranged in a plurality of rows of capacitor unit cells and a plurality of columns of capacitor unit cells;
    wherein each capacitor unit cell of the array of capacitor unit cells comprises a lower metal layer including a first a first plurality of finger electrodes interdigitated with a second plurality of finger electrodes; and
    a plurality of rows of common rails extending through the plurality of rows of capacitor unit cells and electrically coupled with a portion of the first pluralities of finger electrodes;
    a plurality of columns of common rails extending through the plurality of columns of capacitor unit cells and electrically coupled with a portion of the second pluralities of finger electrodes;
    wherein each common rail extending through a column of capacitor unit cells is coupled to a corresponding digital logic bit node, and each common rail extending through a row of capacitor unit cells is coupled to a floating node.

15. The capacitor structure of claim 14, wherein each unit cell comprises an odd number of total finger electrodes of the first and second pluralities of finger electrodes.

16. The capacitor structure of claim 15, wherein the odd number of total finger electrodes includes two exterior finger electrodes, wherein the exterior finger electrodes are not coupled to the floating node.

17. The capacitor structure of claim 16, wherein each capacitor unit cell of the array of capacitor unit cells comprises an upper metal layer including a third plurality of finger electrodes interdigitated with a fourth plurality of finger electrodes;
    the plurality of rows of common rails extending through the plurality of rows of capacitor unit cells is electrically coupled with a portion of the third pluralities of finger electrodes; and
    the plurality of columns of common rails extending through the plurality of columns of capacitor unit cells is electrically coupled with a portion of the fourth pluralities of finger electrodes.

18. The capacitor structure of claim 17, wherein each unit cell comprises an odd number of total finger electrodes of the third and fourth pluralities of finger electrodes, wherein the odd number of total finger electrodes includes two exterior finger electrodes, wherein the exterior finger electrodes are not coupled to the floating node.

* * * * *

UNITED STATES PATENT AND TRADEMARK OFFICE
CERTIFICATE OF CORRECTION

PATENT NO. : 10,707,162 B2
APPLICATION NO. : 16/599011
DATED : July 7, 2020
INVENTOR(S) : Fu et al.

Page 1 of 1

It is certified that error appears in the above-identified patent and that said Letters Patent is hereby corrected as shown below:

In the Claims

Column 13,
Line 14, Claim 1, delete "main capacitor" and insert in place there of --capacitor main--

Column 14,
Line 25, Claim 14, delete "pluralities" and insert in place there of --plurality--

Column 14,
Lines 29-30, Claim 14, delete "pluralities" and insert in place there of --plurality--

Signed and Sealed this
Fifth Day of July, 2022

*Katherine Kelly Vidal*

Katherine Kelly Vidal
*Director of the United States Patent and Trademark Office*